United States Patent
Krajewski et al.

(10) Patent No.: US 11,107,939 B2
(45) Date of Patent: Aug. 31, 2021

(54) SYSTEMS AND METHODS FOR SHINGLING CELLS USING AN ADHESIVE FILM

(71) Applicant: UTICA LEASECO, LLC, Rochester Hills, MI (US)

(72) Inventors: Todd Allen Krajewski, Mountain View, CA (US); Jason Tolentino, San Jose, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 19 days.

(21) Appl. No.: 16/257,569

(22) Filed: Jan. 25, 2019

(65) Prior Publication Data

US 2020/0243704 A1 Jul. 30, 2020

(51) Int. Cl.
| | |
|---|---|
| *H02N 6/00* | (2006.01) |
| *H01L 31/042* | (2014.01) |
| *H01L 31/048* | (2014.01) |
| *H01L 31/05* | (2014.01) |
| *H01L 31/18* | (2006.01) |
| *C09J 7/38* | (2018.01) |
| *C09J 7/29* | (2018.01) |
| *B32B 7/12* | (2006.01) |

(52) U.S. Cl.
CPC .......... *H01L 31/0481* (2013.01); *C09J 7/381* (2018.01); *H01L 31/05* (2013.01); *H01L 31/18* (2013.01); *B32B 7/12* (2013.01); *B32B 2457/12* (2013.01); *C09J 7/29* (2018.01)

(58) Field of Classification Search
CPC ..... H01L 31/0481; H01L 31/05; H01L 31/18; H01L 31/0504; B32B 7/12
See application file for complete search history.

(56) References Cited

U.S. PATENT DOCUMENTS

| | | | | |
|---|---|---|---|---|
| 7,772,484 B2 * | 8/2010 | Li | ........................ | H01L 27/301 136/244 |
| 2009/0235979 A1 * | 9/2009 | Wudu | ................. | H01L 31/0508 136/256 |
| 2012/0325282 A1 * | 12/2012 | Snow | .............. | H01L 31/022425 136/244 |
| 2013/0312809 A1 * | 11/2013 | Luch | ............... | H01L 31/022425 136/244 |

(Continued)

OTHER PUBLICATIONS

International Search Report and Written Opinion corresponding to International Application No. PCT/US20/14907.

*Primary Examiner* — Angelo Trivisonno
(74) *Attorney, Agent, or Firm* — Arent Fox LLP (57) ABSTRACT

This disclosure describes various structures, devices, and arrangements that replace a PSA used to hold shingled cells together with an adhesive film. For example, in an aspect, the present disclosure is directed to a shingled arrangement of photovoltaic (PV) cells. In some aspects, the shingled arrangement of PV cells may include a first PV cell, a second PV cell, and an adhesive film placed between a backside the first PV cell and a front side of the second PV cell. The adhesive film may be thermally bonded to the first PV cell and to the second PV cell after the application of localized heat and pressure and holds the first PV cell and the second PV cell together. Additionally, a bus bar of the second PV cell may be electrically connected to the first PV cell by a conductive via formed through the adhesive film.

26 Claims, 8 Drawing Sheets

(56) References Cited

U.S. PATENT DOCUMENTS

| | | |
|---|---|---|
| 2014/0012401 A1 | 1/2014 | Perek et al. |
| 2015/0034914 A1 | 2/2015 | Lee et al. |
| 2019/0035585 A1 | 1/2019 | Minowa et al. |

* cited by examiner

SYSTEMS AND METHODS FOR SHINGLING CELLS USING AN ADHESIVE FILM

TECHNICAL FIELD

This disclosure relates to shingling of photovoltaic (PV) cells, and more specifically, to the shingling of PV cells using an adhesive film, such as a thin film thermoplastic or thermoset.

BACKGROUND

Pressure-sensitive adhesives ("PSAs") are adhesives which form a bond when pressure is applied to bond the adhesive with a surface (e.g., an adherend). In some implementations, a PSA may not require a solvent, water, or heat to activate the adhesive. PSAs may be used in pressure-sensitive tapes, labels, glue dots, note pads, automobile trim, and a wide variety of other products. One example use of PSAs is to interconnect PV cells (also referred to as solar cells) in a shingled manner, e.g., shingled like roof tiles. This may be achieved by adhering the front side of a first solar cell to the back side of a second solar cell. The first and second solar cells may be electrically connected to each other using electrical conductive adhesive (ECA) epoxies. Current PSAs that are used to join these solar cells do not create a sufficiently strong bond between the solar cells. This allows external stresses to put a load on the joints and breaking the joints apart (e.g., breaks in the ECA epoxy) potentially resulting in intermittent or total loss of electrical contact between the solar cells. The current PSAs also have a structure that results in point contacts and a non-planar structure that can increase stress concentration. Additionally, the process of depositing PSAs typically includes ink jetting the PSA in a liquid form, which can run or flow, and is then subsequently solidified by ultraviolet (UV) curing. This process may result in PSAs being deposited on surfaces outside of the desired location, known as squeeze out, and by sticking to various surfaces, which makes handling of the cells and/or matrices with the shingled cells difficult.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, the present disclosure is directed to a shingled arrangement of photovoltaic (PV) cells. In some aspects, the shingled arrangement of PV cells may include a first PV cell, a second PV cell, and an adhesive film placed between a backside the first PV cell and a front side of the second PV cell. The adhesive film may be thermally bonded to the first PV cell and to the second PV cell after the application of localized heat and pressure and holds the first PV cell and the second PV cell together. Additionally, a bus bar of the second PV cell may be electrically connected to the first PV cell by a conductive via formed through the adhesive film.

In another aspect, the present disclosure is directed to a method for shingling photovoltaic (PV) cells. The method may include applying an adhesive film to a backside of a first PV cell, the adhesive film comprising at least one of a thermoplastic or a thermoset. The method may further include filling one or more vias formed through the adhesive film with a conductive material and aligning a bus bar on a front side of a second PV cell with the filled one or more vias. The method may also include placing a front side of the second PV cell against the adhesive film while maintaining the bus bar and the one or more vias aligned. The method may further include bonding the first PV cell and the second PV cell with one another using localized heat and pressure.

BRIEF DESCRIPTION OF THE DRAWINGS

The novel features believed to be characteristic of aspects of the disclosure are set forth in the appended claims. In the description that follows, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a preferred mode of use, further objects and advances thereof, will be best understood by reference to the following detailed description of illustrative aspects of the disclosure when read in conjunction with the accompanying drawings, wherein:

DETAILED DESCRIPTION

This disclosure describes various structures, devices, and arrangements that replace a PSA used to hold shingled cells together with an adhesive film (e.g., a pre-formed strip of film) that is made of a thermoplastic or thermoset. In some implementations, the adhesive film may be thermally bonded to a back (e.g., backside or back side) of a cell, such as a PV or solar cell, in a desired bonding location. In some implementations, the adhesive film may be formed as a single, contiguous film of material and one or more vias may be formed through the single film of material to expose a back metal contact of the cell. In further implementations, the adhesive film may be formed using separate segments of material, e.g., two segments or strips of film beside each other and spaced apart, where one or more vias can be formed in the spacing between the separate segments of material exposing the back metal contact of the cell. In still further implementations, the adhesive layer may be formed using a single film of material having one or more preformed holes exposing the back metal contact of the cell and through which the one or more vias are formed. A conductive material, such as an ECA epoxy, solder, low temperature solder, etc., may then be placed in the one or more vias and a bus bar on a front (e.g., front side) of a next cell (e.g., a cell to be joined to the cell with the adhesive film) may be aligned with the one or more vias such that when the cells are joined together the back metal contact of the one cell is electrically connected with the bus bar of the other cell by the conductive material in one or more vias. After the cell and the next cell are aligned with one another, the two cells may be bonded together using, for example, localized heat and/or pressure. By using localized heat and/or pressure without the need for curing and cooling, as required by dispensed PSAs, the present disclosure reduces processing times. Additionally, the use of an adhesive, such as a thermoplastic, a thermoset, or any other reactive film adhesive that responds to localized heat and/or pressure provides tensile strength that is stronger than, for example, dispensed PSAs. In some implementations, properties of the adhesive film may be varied to control adhesion, bonding temperature, flow during processing, and when the material is a thermoset, cure rate.

In some implementations, the adhesive film may be made of a modified low-density polyethylene resin (e.g., a coextrudable adhesive resin), a modified ethylene vinyl acetate (e.g. acid, anhydride, etc.), a modified ethylene acetate (e.g. acid, anhydride, acid/acrylate, etc.), an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE). In some implementations, the adhesive film may be selected based on its chemical properties to adhere to a given material, such as, but not limited to, polyethylene naphthalate (PEN), polyethylene terephthalate (PET), and the like. In some cases, the backside of the cell includes a back surface film or layer made of PEN or PET, and the adhesive film is bonded to the back surface film instead. In further implementations, the adhesive film may be selected based on its chemical properties to adhere to a given material, such as, a metal (such, but not limited to, copper (Cu), silver (Ag), aluminum (Al), etc.), or a solar cell, such as a crystalline silicon solar cell, a copper indium gallium selenide (CIGS) solar cell, a cadmium telluride (CdTe), or even an amorphous silicon (a-Si)-based solar cell or a dye sensitized solar cell. Alternatively, or additionally, the material for the adhesive film may be selected based on its rheology, and may have a low melt flow index. Thus, the material to be used for the adhesive film may be selected based on the type of material to which the adhesive layer will be adhered to or based on its rheology (e.g., constrains in the deformation and flow of the material, including its melt flow index).

As used herein the terms "photovoltaic," "photovoltaic element," "PV," "PV cell," and "solar cell" may be used interchangeably to refer to one or more portions of an optoelectronic system or component that produce voltage and/or electric current when exposed to light, and which may be arranged together in a matrix or module in a shingled manner. It is also to be understood that a reference to a single "photovoltaic," "photovoltaic element," "PV," "PV cell," and "solar cell" may also refer to instances of multiples of such devices or structures. Moreover, as used in this disclosure, a "film" may refer to a thin strip of material that is formed and shaped prior to its application to a surface, while a "layer" may be a film or may be a coating of a material that is formed and shaped as part of its application to a surface.

Figure 1:
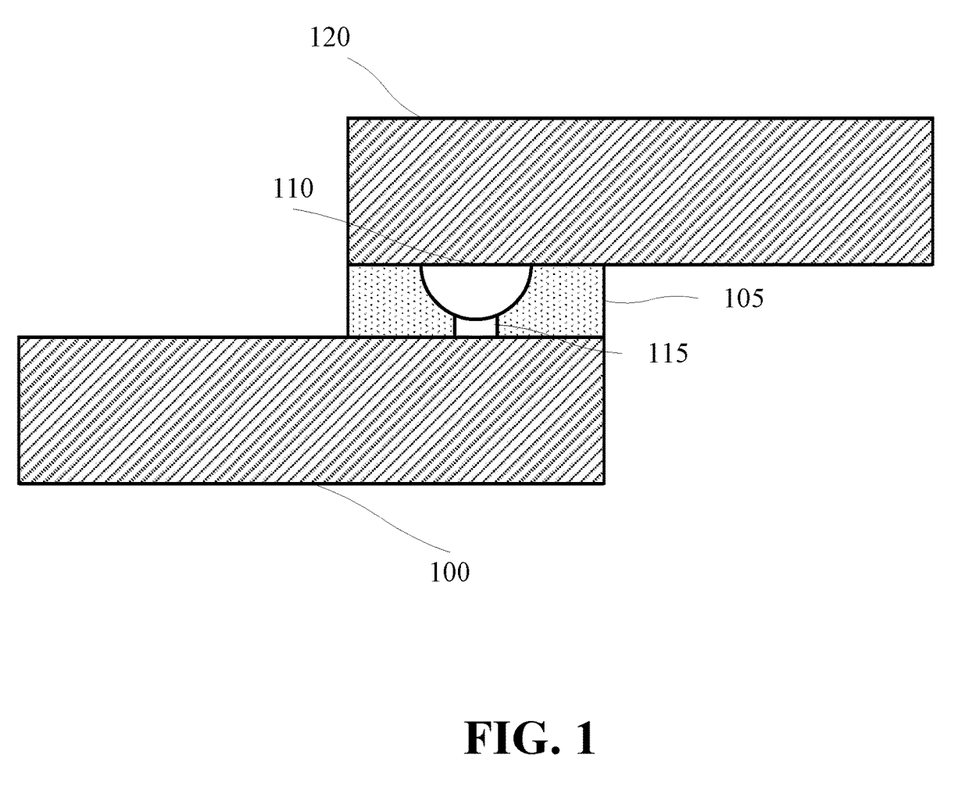
FIG. 1 illustrates an example of shingled cells formed using an adhesive film, in accordance with aspects of this disclosure.

FIG. 1 illustrates an example of shingled cells (e.g., shingled PV cells) formed using an adhesive film, in accordance with aspects of this disclosure. For example, FIG. 1 illustrates a first cell 100 shingled with a second cell 120 using an adhesive film 105 (e.g., a single strip of film). In this example, the first cell 100 and the second cell 120 are shown sunny-side down, that is, the side that is exposed to light (e.g., front side of the cell) is at the bottom and the side not exposed to light (e.g., backside of the cell) is a the top. As discussed in greater detail below with respect to FIGS. 4-7, the adhesive film 105 may be formed using a single film of material or the adhesive film 105 may be an adhesive film stack formed using a plurality of films and/or layers of two or more materials. In some implementations, the adhesive film 105 may be formed on a backside of the first cell 100, i.e., a side of the cell not exposed to light. In an aspect, the first cell 100 and the second cell 120 may be, but need not be limited to, thin-film GaAs photovoltaic cells, including single junction and multi junction GaAs photovoltaic cells. These types of cells may be flexible, lightweight, and highly efficient, which makes them suitable for demanding autonomous power, self-powered, or light-rechargeable applications ranging from indoor light harvesting to spacecraft. Alternatively, the first cell 100 and the second cell 120 may be, for example, a crystalline silicon solar cell, a copper indium gallium selenide (CIGS) solar cell, a cadmium telluride (CdTe), or even an amorphous silicon (a-Si)-based solar cell or a dye sensitized solar cell. As illustrated in FIG. 1, the first cell 100 and the second cell 120 partially overlap with one another. In some implementations, the partial overlap between the first cell 100 and the second cell 120 should be as small as possible to maximize the amount of active area of each cell that is exposed to light. For example, in some implementations, the overlap may be between 1.5 millimeters (mm) and 3 mm, sufficient to cover the size of a bus bar 110 on the front of the second cell 120. Although FIG. 1 illustrates two cells shingled with one another, it should be understood by those of ordinary skill in the arts that any number of cells may be shingled together and strings of such shingled cells can be formed.

Figure 3A:
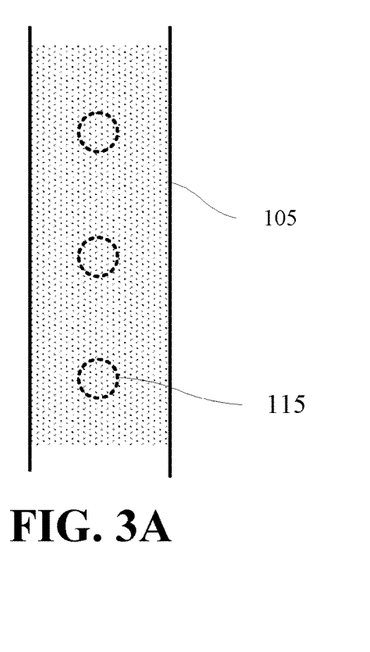
FIGS. 3A-3D illustrate examples of top views of the adhesive film and conductive vias, in accordance with aspects of this disclosure.
Figure 3B:
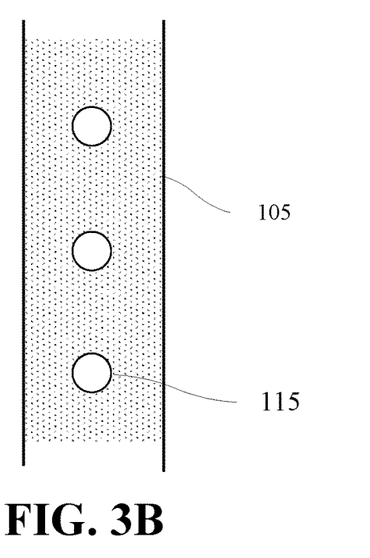
Figure 3C:
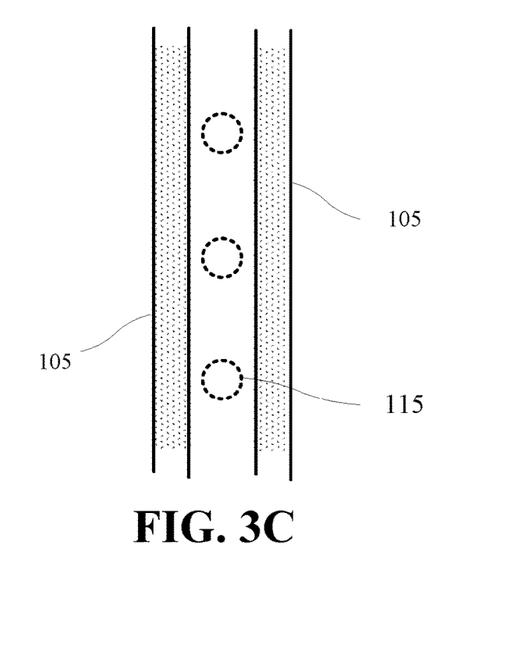
Figure 3D:
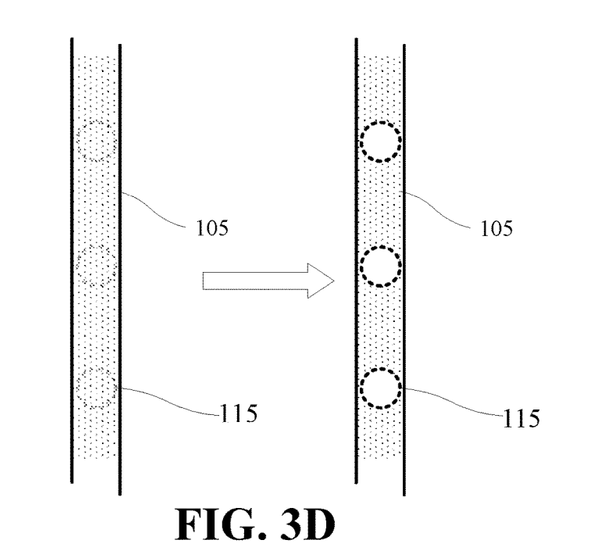

In some implementations, the first cell 110 and the second cell 120 may be electrically connected to each other using the bus bar 110 and one or more vias 115 that are filled with a conductive material (e.g., conductive epoxy, solder). In some implementations, the one or more vias 115 may be formed through the adhesive film 105 to a back metal contact of the first cell 100 such that the first cell 100 (e.g., its back metal contact) is electrically connected to the second cell 120 (e.g., its bus bar 110). For example, the one or more vias 115 may be formed by laser drilling a hole in the adhesive film 105 (as illustrated in FIG. 3A), although it should be understood by those of ordinary skill in the arts that the one or more vias 115 may be formed using other processes. In further implementations, the adhesive film 105 may be formed using separate segments or strips of film, e.g., two segments of film beside each other and spaced apart, where the one or more vias 115 can be formed in the spacing between the separate segments of material exposing the back metal contact of the first cell 100 (as illustrated by FIG. 3B). In still further implementations, the adhesive film 105 may be formed using a layer of film having a pre-formed via 115 exposing the back metal contact of the first cell 100 (as illustrated in FIG. 3C). In some implementations, the one or more vias 115 may be filled with a conductive material, such as an ECA epoxy, solder, low temperature solder, etc. In some implementations, the adhesive film 105 may have a same width as the bus bar 110 (as illustrated by FIG. 3D).

Figure 2:
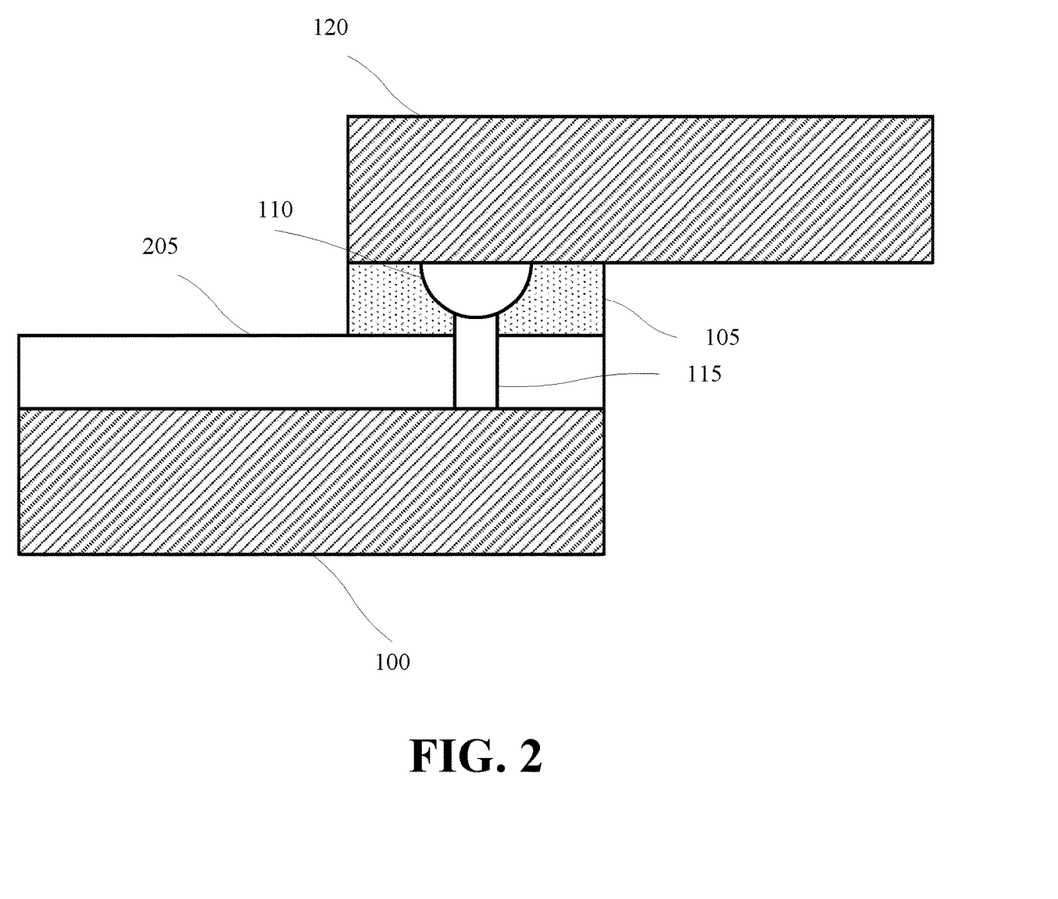
FIG. 2 illustrates another example of shingled cells formed using the adhesive film and an intervening film, in accordance with aspects of this disclosure.

FIG. 2 illustrates another example of shingled cells formed using an adhesive film and an intervening film, in accordance with aspects of this disclosure. For example, FIG. 2 illustrates the first cell 100 shingled with the second cell 120 using the adhesive film 105 and an intervening film 205. The intervening film 205 may be referred to as a back surface film and can be placed on the backside of the first cell 100 for handling (a similar film can be present in the backside of the second cell 120 but it is not shown for simplicity). In some implementations, the intervening film 205 may be, for example, a polyethylene naphthalate (PEN), polyethylene terephthalate (PET), or the like. In some implementations, the intervening film 120 may be formed on a backside of the first cell 100 and the adhesive film 105 may be formed on a backside of the intervening or back surface film 205. Much like the arrangement illustrated in FIG. 1, the first cell 100 and the second cell 120 overlap with one another. In some implementations, the first cell 110 and the second cell 120 may be electrically connected to each other using the bus bar 110 of the second cell 120, the one or more vias 115, and the back metal contact of the first cell 100 (not shown), with the one or more vias 115 being formed through both the intervening film 205 and the adhesive film 105. For example, the one or more vias 115 may be formed by laser drilling a hole in the intervening film 205 and the adhesive film 105, although it should be understood by those of ordinary skill in the arts that the one or more vias 115 may be formed using other processes (see e.g., FIG. 3A). Moreover, like described above in connection with FIGS. 3B and 3C, the adhesive film 105 may include split segments or strips through which the one or more vias 115 is made or may include pre-formed holes or vias 115.

Figure 4:
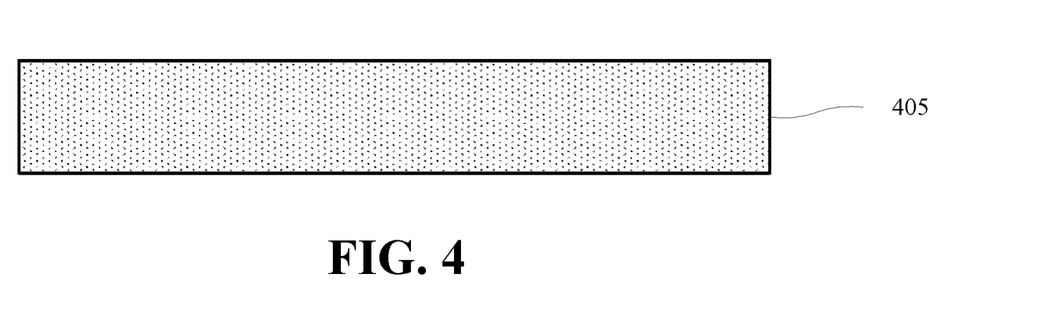
FIG. 4 illustrates an example of a single layer adhesive film used to shingle the cells, in accordance with aspects of this disclosure.

FIG. 4 illustrates an example material used to shingle the cells, in accordance with aspects of this disclosure. For example, FIG. 4 illustrates an adhesive film, e.g., the adhesive film 105 shown in FIG. 1, formed using a single layer of film material 405, including, but not limited to, a thermoplastic, a thermoset, or any other reactive film adhesive. In some implementations, the single layer of film material 405 may be a modified low-density polyethylene resin (e.g., a coextrudable adhesive resin), a modified ethylene vinyl acetate (e.g. acid, anhydride, etc.), a modified ethylene acetate (e.g. acid, anhydride, acid/acrylate, etc.), an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE). In such implementations, the single layer of film material 305 may have a thickness between 5 micrometers ($\mu$m) and 50 $\mu$m, for example.

Figure 5:
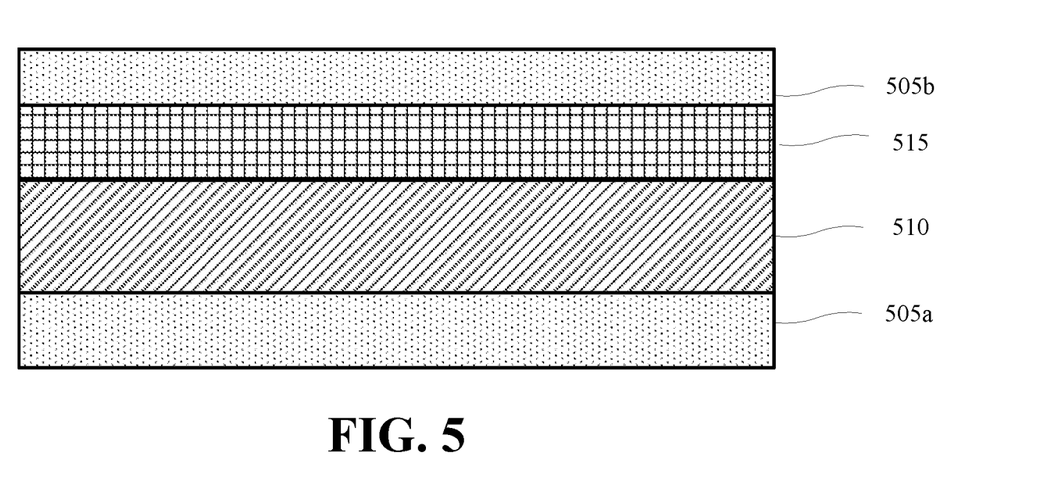
FIG. 5 illustrates an example of an adhesive film stack used to shingle the cells, in accordance with aspects of this disclosure.

FIG. 5 illustrates an example of an adhesive film stack used to shingle the cells, in accordance with aspects of this disclosure. For example, FIG. 5 illustrates an adhesive film stack, e.g., that is used as the adhesive film 105 shown in FIG. 1, formed using a plurality of films and/or layers of materials. For example, the adhesive film stack includes a first adhesive film 505*a*, a carrier film 510 formed on a backside of the first adhesive film 505*a* for improving handling strength (e.g., improved stiffness), and a second adhesive film 505*b*. The carrier film 510 is therefore between the first adhesive film 505*a* and the second adhesive film 505*b*. In some implementations, the carrier film 510 may be treated for adhesion using an adhesion improvement technique, such as, a plasma technique or a corona technique, as would be understood by those of ordinary skill in the arts. In still further implementations, an optional tie layer or a primer 515 may be formed on the backside of the carrier film 510 to improve adhesion. In some implementations, the first adhesive film 505*a* and the second adhesive film 505*b* may each have a thickness between 1 $\mu$m and 25 $\mu$m, and the carrier film 510 may have a thickness between 12 $\mu$m and 50 $\mu$m. In aspects, the first adhesive film 505*a* and the second adhesive film 505*b* may be made of an adhesive, such as a thermoplastic, a thermoset, or any other reactive film adhesive. For example, the first adhesive film 505*a* and the second adhesive film 505*b* may be a modified low-density polyethylene resin (e.g., a coextrudable adhesive resin), a modified ethylene vinyl acetate (e.g. acid, anhydride, etc.), a modified ethylene acetate (e.g. acid, anhydride, acid/acrylate, etc.), an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE).

Figure 6:
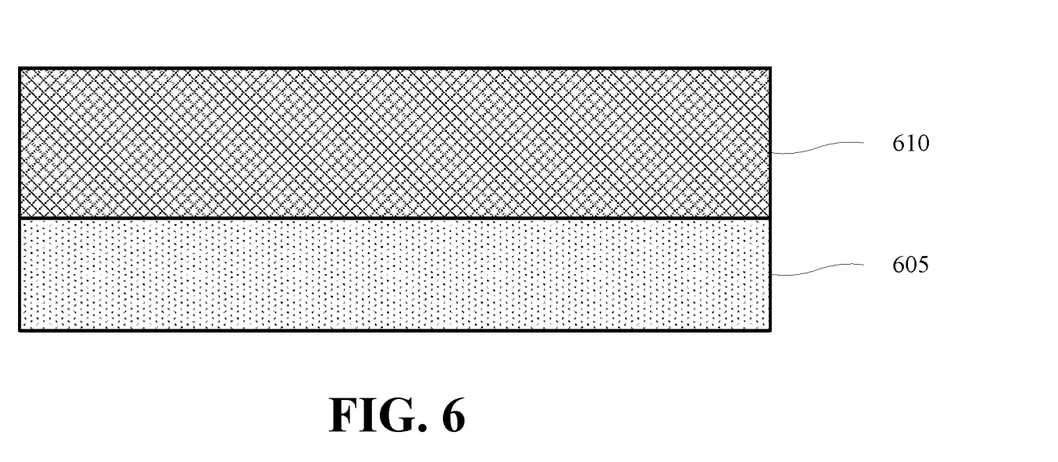
FIG. 6 illustrates an example of an adhesive film used to shingle the cells with a release layer for handling, in accordance with aspects of this disclosure.
Figure 9A:
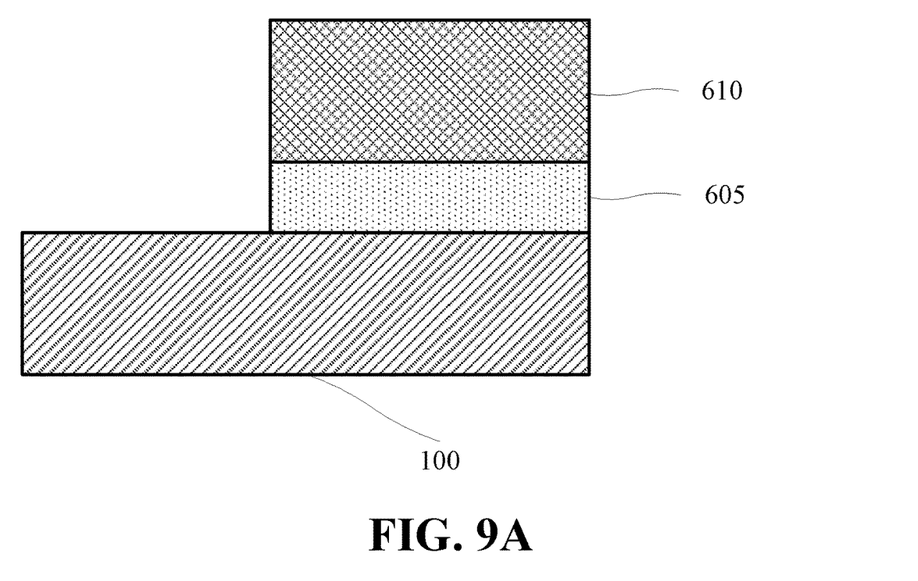
FIGS. 9A and 9B illustrate an example of removing a release layer from an adhesive film, in accordance with aspects of this disclosure.
Figure 9B:
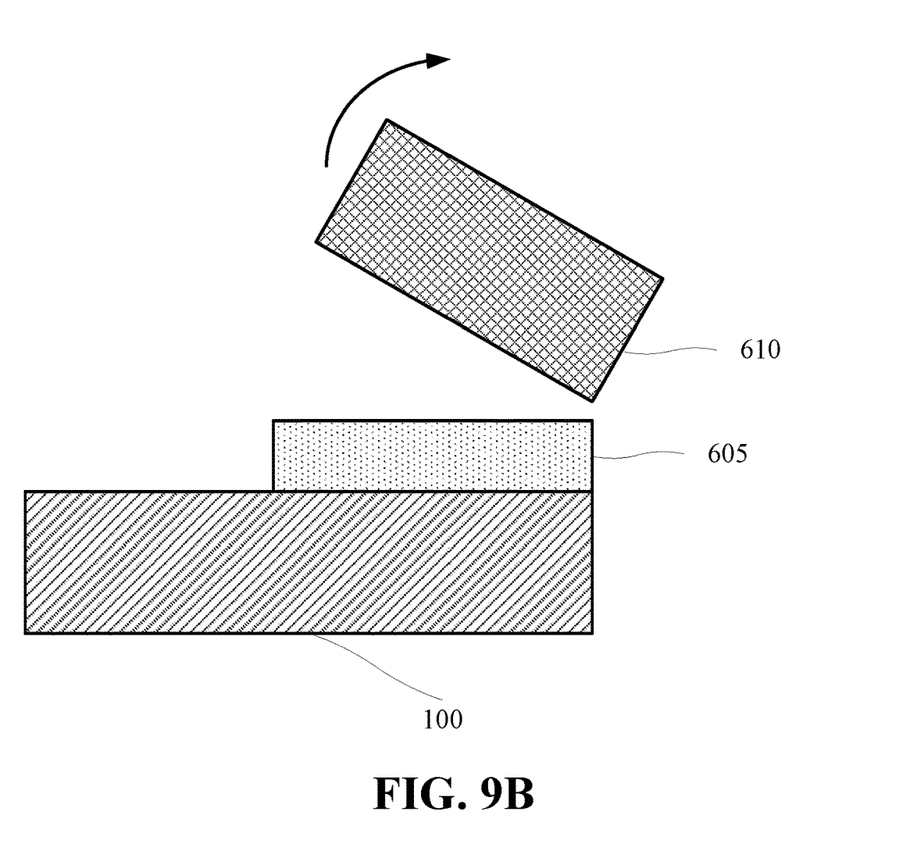

FIG. 6 illustrates an example of an adhesive film used to shingle the cells with a release layer, in accordance with aspects of this disclosure. For example, FIG. 6 illustrates an adhesive film stack formed using a plurality of films and/or layers of materials. For example, the adhesive film stack in FIG. 6 may include a single layer strip of adhesive film 605 and a release layer 610 formed on a backside of the adhesive film 605. In some implementations, the adhesive film 605 may be an adhesive, such as a thermoplastic, a thermoset, or any other reactive film adhesive. For example, the adhesive film 605 may be a modified low-density polyethylene resin (e.g., a coextrudable adhesive resin), a modified ethylene vinyl acetate (e.g. acid, anhydride, etc.), a modified ethylene acetate (e.g. acid, anhydride, acid/acrylate, etc.), an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE), or a PSA. The adhesive film 605 may have a thickness between 1 $\mu$m and 25 $\mu$m. In further implementations, the release layer 610 may be removed before any further processing may be performed, e.g., forming one or more vias in the adhesive layer or bonding a second cell to a first cell. For example, as illustrated in FIGS. 9A and 9B, the adhesive film stack with the adhesive film 605 and the release layer 610 can be placed on the backside of the first cell 100 (FIG. 9A) and then the release layer 610 can be removed before the second cell 120 is joined with the first cell 100 (FIG. 9B).

Figure 7:
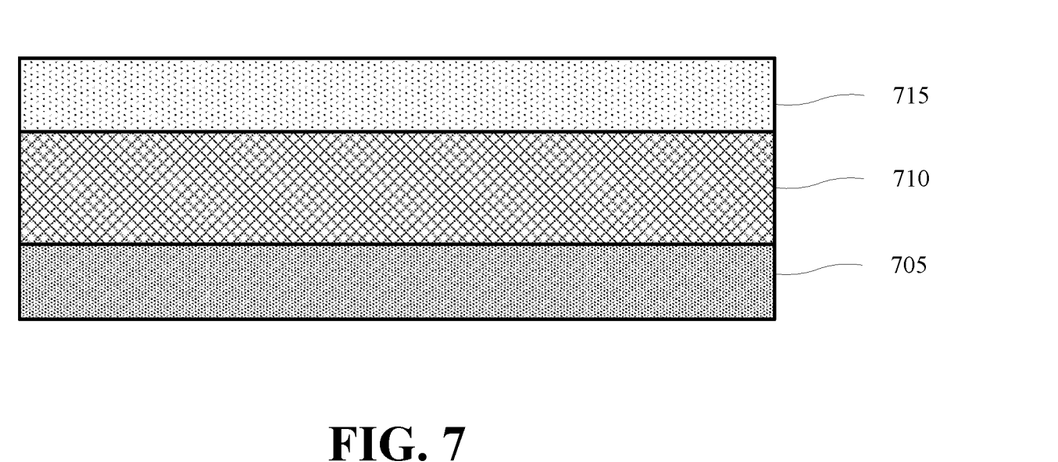
FIG. 7 illustrates another example of an adhesive film stack used to shingle the cells, in accordance with aspects of this disclosure.

FIG. 7 illustrates another example of an adhesive film stack used to shingle the cells, in accordance with aspects of this disclosure. For example, FIG. 7 illustrates an adhesive film stack, e.g., that may be used as the adhesive layer 105 shown in FIG. 1, formed using a plurality of films and/or layers of materials. For example, the plurality of films and/or layers of materials may include a first adhesive film 705, a carrier film 710 formed on a backside of the first adhesive film 705 for improving handling strength, and a second adhesive film 715 formed on a backside of the carrier film 710. In some implementations, the first adhesive film 705 may be a PSA that includes a release liner (not shown) or may be activated using ultra-violet (UV) or infrared (IR) radiation. The first adhesive film 705 may also be thermal or UV crosslinked after bonding with, for example, a PEN layer. The first adhesive film 705 may also have a thickness between 1 μm and 25 μm. The carrier film 710 may have a thickness between 12 μm and 50 μm. In some implementations, the second adhesive film 715 may be an adhesive, such as a thermoplastic, a thermoset, or any other reactive film adhesive. For example, the adhesive film 715 may be a modified low-density polyethylene resin (e.g., a coextrudable adhesive resin), a modified ethylene vinyl acetate (e.g. acid, anhydride, etc.), a modified ethylene acetate (e.g. acid, anhydride, acid/acrylate, etc.), an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE). In some implementations, the adhesive film 715 may be have a thickness between 1 μm and 25 μm.

Figure 8:
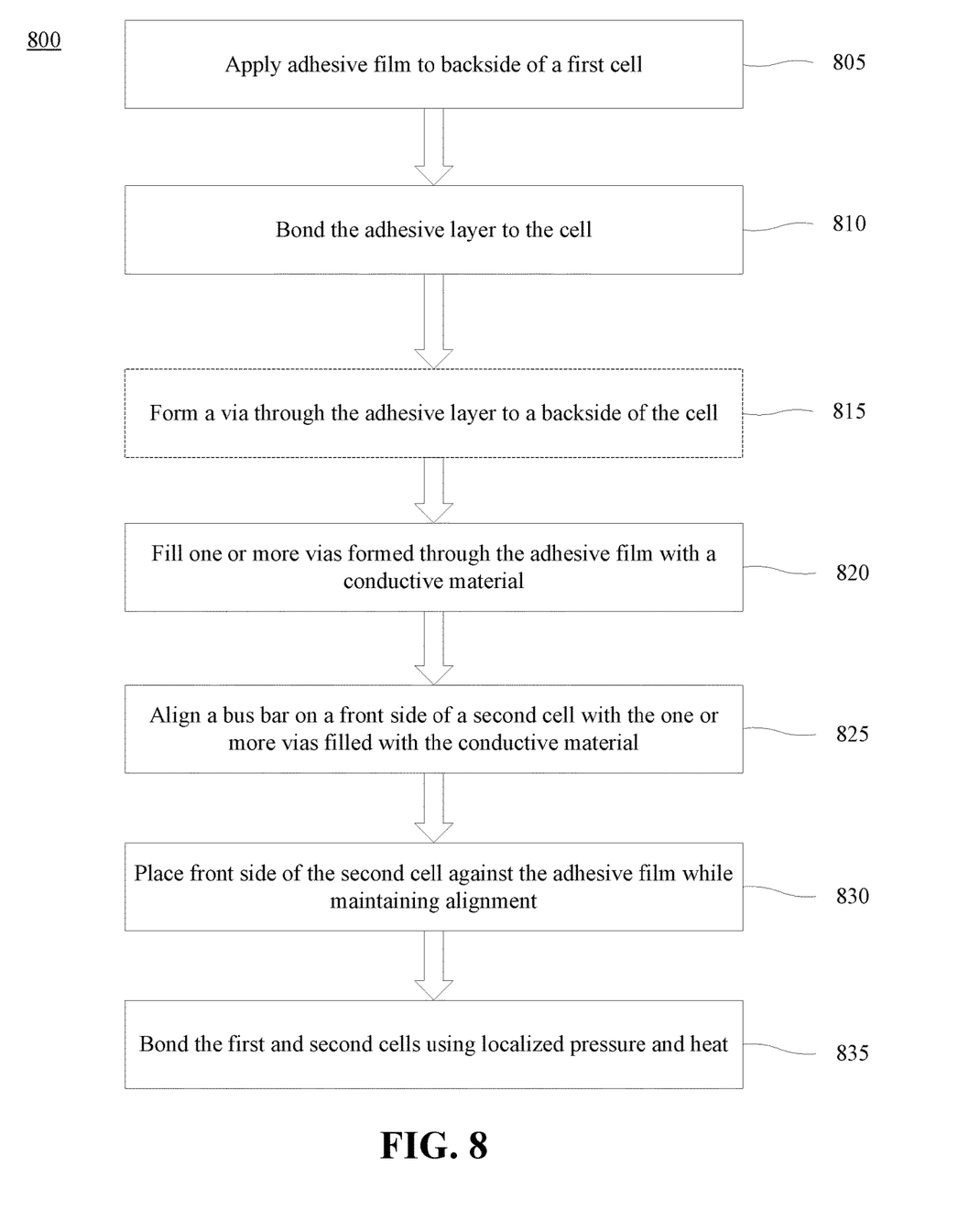
FIG. 8 illustrates an example method for shingling cells using the adhesive film, in accordance with aspects of this disclosure.

FIG. 8 illustrates an example method for shingling cells using the adhesive film structures described above, in accordance with aspects of this disclosure. For example, a method 800 may include applying an adhesive film to a first cell at 805. In some implementations, the adhesive film may be a single film of material or a stacked structure (e.g., adhesive film stack). In some implementations, the adhesive film may be formed on a backside of the first cell, i.e., a side of the first cell not exposed to light. In further implementations, the adhesive film may be formed using separate segments or strips spaced apart and where the one or more vias is formed in the space in between the separate segments or strips exposing a back metal contact of the first cell. In still further implementations, the adhesive film may be formed using a single film having a pre-formed via or vias exposing the back metal contact of the first cell. The method 800 may also include bonding the adhesive film to the first cell at 810, which may be part of the application of the adhesive film at 805. For example, in some implementations, the adhesive film may be thermally bonded to the first cell.

The method 800 may optionally include forming via through the adhesive film at 815. In some implementations, the one or more vias may be formed through the adhesive layer to a back metal contact of the first cell. For example, the one or more vias may be formed by laser drilling a hole in the adhesive film, although it should be understood by those of ordinary skill in the arts that the one or more vias may be formed using other processes. In some implementations, the method 700 may further include filling the one or more vias with a conductive material at 820. For example, the one or more vias may be filled with a conductive material, such as an ECA epoxy, solder, low temperature solder, etc.

Figure 10:
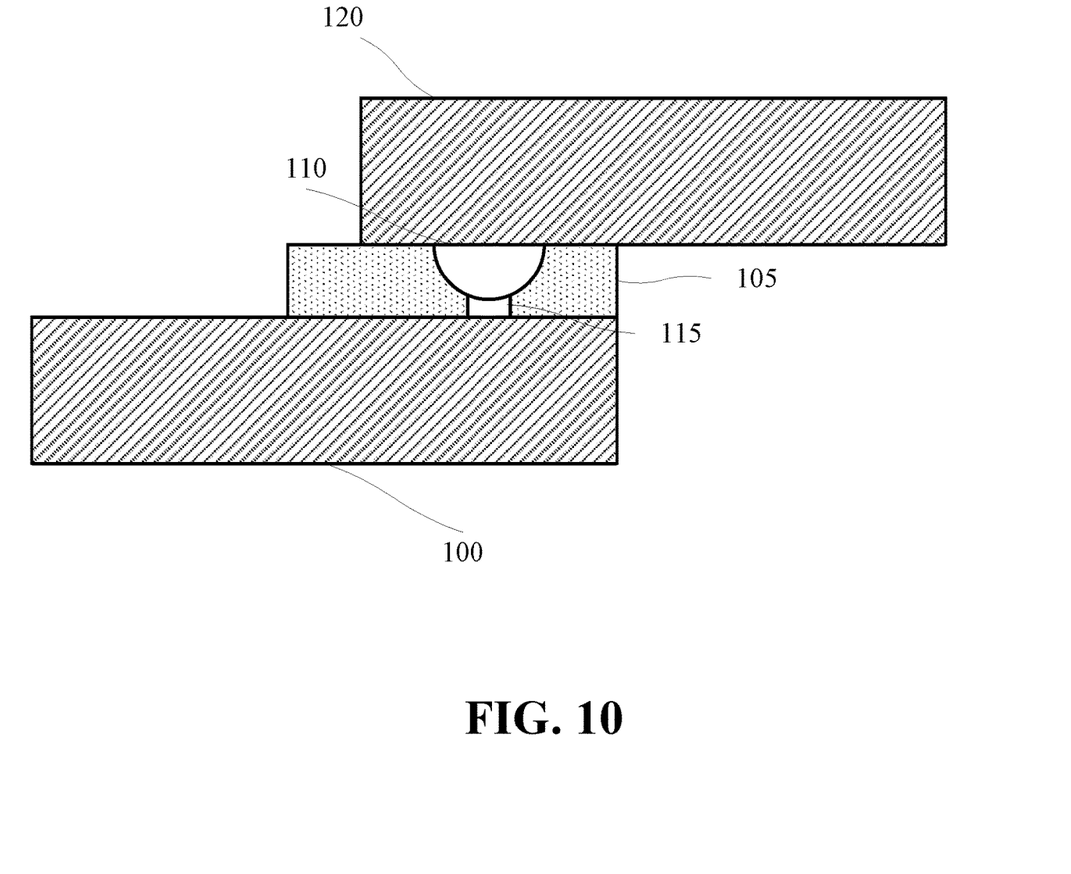
FIG. 10 illustrates and example of an extended adhesive film, in accordance with aspects of this disclosure.

The method 800 may also include aligning a bus bar of a second cell with the filled via at 825. After the first cell and the second cell are aligned with one another, the method 800 may include placing the front side of the second cell against the adhesive film while maintaining the alignment at 830 and then bonding the two cells with one another at 835. For example, first cell and the second cell may be bonded to another using localized heat and/or pressure. That is, the localized heat and/or pressure may be applied to an overlapping area between the first cell and the second cell. In some implementations, the overlap between the first cell and the second cell should be as small as possible to maximize the amount of active area of each cell exposed to light. For example, in some implementations, the overlap may be between 1.5 millimeters (mm) and 3 mm. In some implementations, as shown in FIG. 10, the adhesive film (e.g., the adhesive film 105) may extend to the left by some amount in the backside of the first cell (area not exposed to light) without causing the second cell (e.g., the second cell 120) to lose any active area (area exposed to light). By using localized heat and/or pressure without the need for curing and cooling, as required by dispensed PSAs, the present disclosure reduces processing times. Additionally, the use of an adhesive, such as a thermoplastic, a thermoset, or any other reactive film adhesive that responds to localized heat and/or pressure provides tensile strength that is stronger than, for example, PSAs.

The above description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Implementations were chosen and described in order to best describe certain principles and practical applications, thereby enabling others skilled in the relevant art to understand the subject matter, the various implementations, and the various modifications that are suited to the particular uses contemplated. It is therefore intended that the scope of the techniques described herein be limited not by this Detailed Description, but rather by any claims that issue on an application based hereon. Accordingly, the disclosure of various implementations is intended to be illustrative, but not limiting, of the scope of the embodiments, which is set forth in the following claims.

What is claimed is:

1. A shingled arrangement of photovoltaic (PV) cells comprising;
    a first PV cell;
    a second PV cell; and
    an adhesive film placed between a backside the first PV cell and a front side of the second PV cell, the adhesive film is thermally bonded to the first PV cell and to the second PV cell after an application of localized heat and pressure and holds the first PV cell and the second PV cell together,
    wherein a bus bar of the second PV cell is electrically connected to the first PV cell by a conductive via formed through the adhesive film, and
    wherein the adhesive film is a single strip of film having a same width of the bus bar of the second PV cell.

2. The shingled arrangement of PV cells of claim 1, wherein the adhesive film comprises a single layer of a thermoplastic or a thermoset.

3. The shingled arrangement of PV cells of claim 2, wherein the thermoplastic or the thermoset comprises a modified low-density polyethylene resin, a modified ethylene vinyl acetate, a modified ethylene acetate, an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE).

4. The shingled arrangement of PV cells of claim 1, wherein:

the adhesive film is an adhesive film stack that comprises a first adhesive film adjacent to the backside of the first PV cell, a second adhesive film adjacent to the front side of the second PV cell, and a carrier film between the first adhesive film and the second adhesive film, the carrier film is configured to increase a stiffness of the adhesive film stack, and each of the first adhesive film and the second adhesive film is made of a single layer of a thermoplastic or a thermoset.

5. The shingled arrangement of PV cells of claim 4, wherein the carrier film is treated using an adhesion improvement technique.

6. The shingled arrangement of PV cells of claim 4, further comprising a tie layer formed on a backside of the carrier film to improve adhesion.

7. The shingled arrangement of PV cells of claim 4, wherein the thermoplastic or the thermoset comprises a modified low-density polyethylene resin, a modified ethylene vinyl acetate, a modified ethylene acetate, an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE).

8. The shingled arrangement of PV cells of claim 4, wherein a thickness of the first adhesive film and a thickness of the second adhesive film are both smaller than a thickness of the carrier film.

9. The shingled arrangement of PV cells of claim 1, wherein:

the adhesive film is an adhesive film stack that comprises a first adhesive film adjacent to the backside of the first PV cell, a second adhesive film adjacent to the front side of the second PV cell, and a carrier film between the first adhesive film and the second adhesive film, the carrier film is configured to increase a stiffness of the adhesive film stack, the first adhesive film is made of a pressure-sensitive adhesive (PSA), and the second adhesive film is made of a single layer of a thermoplastic or a thermoset.

10. The shingled arrangement of PV cells of claim 9, wherein the thermoplastic or the thermoset comprises a modified low-density polyethylene resin, a modified ethylene vinyl acetate, a modified ethylene acetate, an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE).

11. The shingled arrangement of PV cells of claim 9, wherein a thickness of the first adhesive film is smaller than a thickness of the second adhesive film, and a thickness of the carrier film is greater than both the thickness of the first adhesive film and the thickness of the second adhesive film.

12. The shingled arrangement of PV cells of claim 1, wherein:

the adhesive film includes a first strip and a second strip to a side of the first strip and separated from the first strip by a spacing, and the conductive via formed through the adhesive film is formed in the spacing that separates the first strip from the second strip.

13. The shingled arrangement of PV cells of claim 1, wherein:

the adhesive film includes a plurality of holes formed prior to placing the adhesive film between the first PV cell and the second PV cell, and the conductive via formed through the adhesive film is formed through one of the plurality of holes formed in the adhesive film.

14. The shingled arrangement of PV cells of claim 1, wherein:

the first PV cell includes a back surface film on the backside of the first PV cell, the adhesive film is placed between the back surface film and the front side of the second PV cell, and the conductive via is formed through the adhesive film and through a back surface layer.

15. The shingled arrangement of PV cells of claim 14, wherein the back surface layer is made of polyethylene naphthalate (PEN) or polyethylene terephthalate (PET).

16. A method for shingling photovoltaic (PV) cells comprising:

applying an adhesive film to a backside of a first PV cell, the adhesive film comprising at least one of a thermoplastic or a thermoset;

filling one or more vias formed through the adhesive film with a conductive material;

aligning a bus bar on a front side of a second PV cell with the filled one or more vias;

placing a front side of the second PV cell against the adhesive film while maintaining the bus bar and the one or more vias aligned; and bonding the first PV cell and the second PV cell with one another using at least one of localized heat or pressure;

wherein applying the adhesive film to the backside of the first PV cell comprises thermally bonding the adhesive film to the backside of the first PV cell.

17. The method of claim 16, wherein the thermoplastic or the thermoset comprises a modified low-density polyethylene resin, a modified ethylene vinyl acetate, a modified ethylene acetate, an anhydride-modified high-density polyethylene, an anhydride-modified linear low-density polyethylene, an anhydride-modified polypropylene, an acid-modified ethylene terpolymer, an ethylene/acrylate copolymer resin, an ionomer, a polyolefin (POE), an ethylene-vinyl acetate (EVA), a thermoplastic polyurethane (TPUR, TPU), or a polyethylene (PE).

18. The method of claim 16, wherein the adhesive film comprises a single, contiguous film of material, and the method further comprises forming the one or more vias through the adhesive film to expose a metal contact of the first PV cell.

19. The method of claim 16, wherein the adhesive film is a single strip of film wider than a size of the bus bar of the second PV cell.

20. The method of claim 16, wherein the adhesive film is a single strip of film having a same width of the bus bar of the second PV cell.

21. The method of claim 16, wherein:

the adhesive film is an adhesive film stack that comprises a first adhesive film adjacent to the backside of the first PV cell, a second adhesive film adjacent to the front side of the second PV cell, and a carrier film between the first adhesive film and the second adhesive film, the carrier film is configured to increase a stiffness of the adhesive film stack, and each of the first adhesive film and the second adhesive film is made of a single layer of the thermoplastic or the thermoset.

22. The method of claim 16, wherein:
the adhesive film is an adhesive film stack that comprises a first adhesive film adjacent to the backside of the first PV cell, a second adhesive film adjacent to the front side of the second PV cell, and a carrier film between the first adhesive film and the second adhesive film,
the carrier film is configured to increase a stiffness of the adhesive film stack,
the first adhesive film is made of a pressure-sensitive adhesive (PSA), and
the second adhesive film is made of a single layer of the thermoplastic or the thermoset.

23. The method of claim 16, wherein:
a release layer is attached to a top portion of the adhesive film prior to an application of the adhesive film to the backside of the first PV cell,
applying the adhesive film to the backside of the first PV cell comprises applying a bottom portion of the adhesive film to the backside of the first PV cell and removing the release layer from the top portion of the adhesive film.

24. The method of claim 23, wherein a thickness of the release layer is greater than a thickness of the adhesive film to increase stiffness for handling of the adhesive film.

25. The method of claim 16, wherein:
the first PV cell includes a back surface film on the backside of the first PV cell,
applying the adhesive film to the backside of the first PV cell comprises applying the adhesive film to the back surface film of the first PV cell, and
filling the one or more vias comprises filling the one or more vias formed through the adhesive film and the back surface film.

26. The method of claim 25, wherein the back surface film is made of polyethylene naphthalate (PEN) or polyethylene terephthalate (PET).

\* \* \* \* \*